(12) United States Patent
Seawright

(10) Patent No.: US 6,539,477 B1
(45) Date of Patent: Mar. 25, 2003

(54) SYSTEM AND METHOD FOR CONTROL SYNTHESIS USING A REACHABLE STATES LOOK-UP TABLE

(75) Inventor: J. Andrew Seawright, Mountain View, CA (US)

(73) Assignee: Chameleon Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/518,553

(22) Filed: Mar. 3, 2000

(51) Int. Cl.[7] .................................................. G06F 9/00
(52) U.S. Cl. ........................................ 713/100; 708/232
(58) Field of Search ....................... 713/1, 100; 708/232

(56) References Cited

U.S. PATENT DOCUMENTS

| | | | | |
|---|---|---|---|---|
| 5,970,254 A | * | 10/1999 | Cooke et al. | 395/800.37 |
| 6,006,321 A | * | 12/1999 | Abbott | 712/43 |
| 6,028,445 A | * | 2/2000 | Lawman | 326/38 |
| 6,150,836 A | * | 11/2000 | Abbott | 326/38 |
| 6,182,268 B1 | * | 1/2001 | McElvain | 716/1 |
| 6,311,200 B1 | * | 10/2001 | Hanrahan et al. | 708/232 |

* cited by examiner

Primary Examiner—Dennis M. Butler
(74) Attorney, Agent, or Firm—Thelen Reid & Priest LLP; Robert E. Krebs

(57) ABSTRACT

A system and method of implementing thereof that maps and condenses system control using reachable state control words is described. The system includes a control logic block, a look-up table which stores N-bit reachable state control words derived from an implementation description N-bit control signal, and a logic hardware block. The control logic block accesses the look-up table with a M-bit control word address. The accessed look-up table outputs a N-bit reachable state control word which is used to control the logic hardware block so as to simulate functions as defined by a user input description. A method for implementing the system is performed by synthesizing the user input description to generate an implementation description which describes a control model of the system in terms of a control logic block driving a logic hardware block with a N-bit control signal. The implementation description is analyzed to determine the reachable states of the N-bit control signal. A look-up table is created by storing N-bit reachable state control words corresponding to each reachable state of the N-bit control signal. A mapping function is determined between each reachable state control word stored in the look-up table and a M-bit control word address for accessing the look-up table. Finally, a control logic block is configured or programmed to implement the determined mapping function.

19 Claims, 6 Drawing Sheets

SYSTEM AND METHOD FOR CONTROL SYNTHESIS USING A REACHABLE STATES LOOK-UP TABLE

BACKGROUND OF THE INVENTION

1. Field of The Invention

The present invention relates to a technique for synthesizing control logic and mapping it in an efficient manner, and particularly to condensing and storing control signals corresponding to reachable states for driving a reconfigurable piece of logic hardware so as to minimize control logic circuitry.

2. State of The Art

Digital circuits are often designed with a control model having a logic hardware block 1 for performing a specific function and a control logic block 2 for generating control signals for driving the logic hardware block as shown in FIG. 1A.

The control logic block 2 is often implemented using logic gates, programmable logic arrays (PLAs), gate arrays, standard cells, and/or field programmable gate arrays (FPGAs) for implementing a specific logical function in order to generate the set of control signals. The internal logic within the control logic block 2 of the control model may be derived, compiled, or synthesized from a user's input description/statements which define the function that the control model is to perform. A user's input description may comprise a hardware description language such as Verilog code or a higher lever programming language such as the C programming language, or may comprise any other description language used to describe the control model shown in FIG. 1A.

The control logic block 2 provides N control signals from a set of registers (R1, R2, R3, RN) each having contents determined by a given function implemented by the control logic within the control block. For instance, as shown in FIG. 1A, control signal 1 is provided by register R1 which is determined by a function f1. Similarly, driving signal 2 is provided by register R2 which is determined by a function f2. The functions (e.g., f1, f2, etc.) are embodied within the control logic block as logic gates and registers so as to create a finite state machine (FSM) where the current state is dependent on previous state conditions. In a simplified example, if f1=A AND B, then the function f1 might be embodied as an AND gate having its inputs coupled to input signals A and B and its output coupled to register R1. In general, the more complex the function is, the more logic circuitry is required. Commonly in this type of system, condition codes and flag signals generated in the logic hardware block 1 are fed back to the control logic block 2 as inputs.

FIG. 1B shows an example of a system for performing logic circuit synthesis which compiles the user's input description of the function to be performed for the control model shown in FIG. 1A. In one such logic synthesis system (described in U.S. Pat. No. 5,970,254, assigned to the assignee of the present application, and incorporated herewith), the user input description 3 is synthesized by synthesis tool 8 to generate configuration information 9 which, in this example, is stored into hard disc memory 10. The synthesis system also includes a Reconfigurable Logic Hardware Fabric 4 having a reconfigurable control path 5, a reconfigurable datapath 6, and a reconfigurable memory path 7, each having an associated configuration memories 12A–12C, respectively. Configuration bit streams 11 are loaded from the memory 10 into configuration memories 12A–12C for configuring each of the control path, datapath and memory path to synthesize the logic function as described in the original user input description.

The user input description 3, or the corresponding configuration information synthesized therefrom, may define boolean logic statements and conditions to be implemented by the control path 5 of the Reconfigurable Logic Hardware Fabric 4. For instance, a given set of control signals a, b, c, can be expressed in a logic function statement within the input description as follows: (a AND b) OR c. The configuration bits synthesized from the user description defining this logic function are used to configure the control path 5 which, in turn, performs the logic function and generates control signals 10A for coupling to the datapath 7. The datapath 7 is made up of a plurality of logic circuits (not shown) which are designed to perform a plurality of functions dependent on the configuration bit stream provided from its corresponding configuration memory 12 and dependent on the control signals provided from control path 5. For instance, each logic circuit (also referred to as a datapath unit (DPU)) can perform any type of boolean function as well as multiplexing, decrementation, and incrementation. One exemplary embodiment of a DPU is described in U.S. patent application Ser. No. 09/307,072, filed May 7, 1999 and incorporated herewith.

In a similar manner, control block 5 provides control signals to memory path 6 for controlling memory read and write operations, dependent on the synthesized input description.

Hence, the synthesis system shown in FIG. 1B utilizes the control model as shown in FIG. 1A. Specifically, a control logic block (e.g., control path 5) provides a set of control signals to a logic hardware block (e.g., either/or both of datapath 7 and memory path 6) dependent on the user input description.

The present invention is a system and method of efficiently providing control or driving signals from a control logic block to a piece of logic hardware by condensing and mapping control logic block functions to a look-up table thereby minimizing control logic circuitry. This system and method of providing control are particularly adaptable to a logic synthesis system having reconfigurable control and datapath circuitry such as described above.

SUMMARY OF THE INVENTION

A system having a control structure which includes a look-up table which stores reachable states of control signals and a method thereof of implementing the system is described. An input description is provided by a system user to define the behavior of the function to be implemented by the system. The system includes a control logic block configured to provide a M-bit control signal address to access a look-up table storing the reachable states of a N-bit control signal for driving a logic hardware block, where M<<N.

In accordance with the method of implementing the above system, initially, the input description is synthesized to generate an implementation description of the system. The implementation description describes the system in terms of a control model having a control model control logic block which drives a control model logic hardware block with N control signals. The implementation description is analyzed to determine the reachable states of the N control signals (i.e., the different possible combinations of the N-bit control signal dependent on the functions defined by implementation description). A look-up table is created in such that each entry of the look-up table stores a N-bit control word corresponding to each reachable state of the N control signals. Each entry in the look-up table represents configuration information for driving the logic hardware block to perform functions as defined by the input description. Next, a control logic block is configured or programmed by 1) determining a mapping function between the reachable states of the N-bit control signal to a M-bit address for accessing each look-up table entry wherein each reachable state as defined by the original N driving signals is mapped to a different address and 2) by implementing the mapping function in the control logic block. In one embodiment, the mapping function can be implemented by programming a programmable logic array (e.g., PLA), or any other similar programmable device. In another embodiment, the mapping function is implemented by determining configuration bits for programming a reconfigurable control logic block to perform the mapping function. Once the control structure is established by configuring the control logic block and creating the reachable state look-up table, the control logic block (configured by the predetermined configuration bits) implements the mapping function between the reachable states and the look-up table addresses and generates a M-bit address for accessing a N-bit reachable state control word in the look-up table. The logic hardware block is then driven by the accessed N-bit control word and performs its function as defined by the input description.

In an alternative embodiment, the system and method of control is employed in a reconfigurable logic synthesis system having a reconfigurable logic hardware fabric which includes at least a reconfigurable control path and reconfigurable datapath where the datapath includes a plurality of programmable datapath units (DPUs). A user input description defines the function to be synthesized by the reconfigurable logic hardware fabric. The reconfigurable control path is configured to output M-bit control signal addresses, each for accessing a different reachable state look-up table— one per DPU in the datapath. Each of the accessed reachable state look-up tables outputs a N-bit control signal for driving its corresponding DPU.

In the embodiment of the method of implementing the reconfigurable system, the user input description is initially synthesized to generate an implementation description of the system. The implementation description describes the system in terms of a control model having a control model control path which drives a control model datapath with N control signals and in terms of the hardware elements which are to be implemented by the datapath of the system. The implementation description is analyzed to identify the hardware elements called out within the implementation description so as to group and assign them in an efficient manner into specific DPUs. In addition, the implementation description is analyzed to determine the reachable states of the N control signals for driving each of the DPUs. A look-up table, referred to as a configuration storage memory (CSM), is created for each DPU in which each entry in the CSM stores a N-bit control word corresponding to one of the determined reachable states for each DPU. Each entry in the CSM table represents control or configuration information for driving the grouped hardware elements within the DPU to perform functions as originally designated in the user description. Next, the reconfigurable control path is configured by 1) determining for each set of CSM and its corresponding DPU the mapping function between the reachable states of the N-bit driving signal associated with the grouped hardware elements in the DPU and a M-bit control word address for accessing the DPU's corresponding CSM and 2) determining configuration/programming bits for programming or configuring the control path to implement each of the mapping functions. Once the control structure is established by configuring the control logic block and creating the CSM for each DPU, the control path and datapath simulate a logic circuit as defined by the input description.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

The present invention, in general, is a system which includes a control structure having a look-up table for storing reachable state control words for driving a logic hardware block to perform the given function as defined by a synthesized or compiled input description. Providing such a control structure has the effect of minimizing the complexity of the control logic circuitry which embodies the compiled input description and reduces the number of wires between the control logic block and the logic hardware block, particularly in a reconfigurable system implementation.

Figure 2:
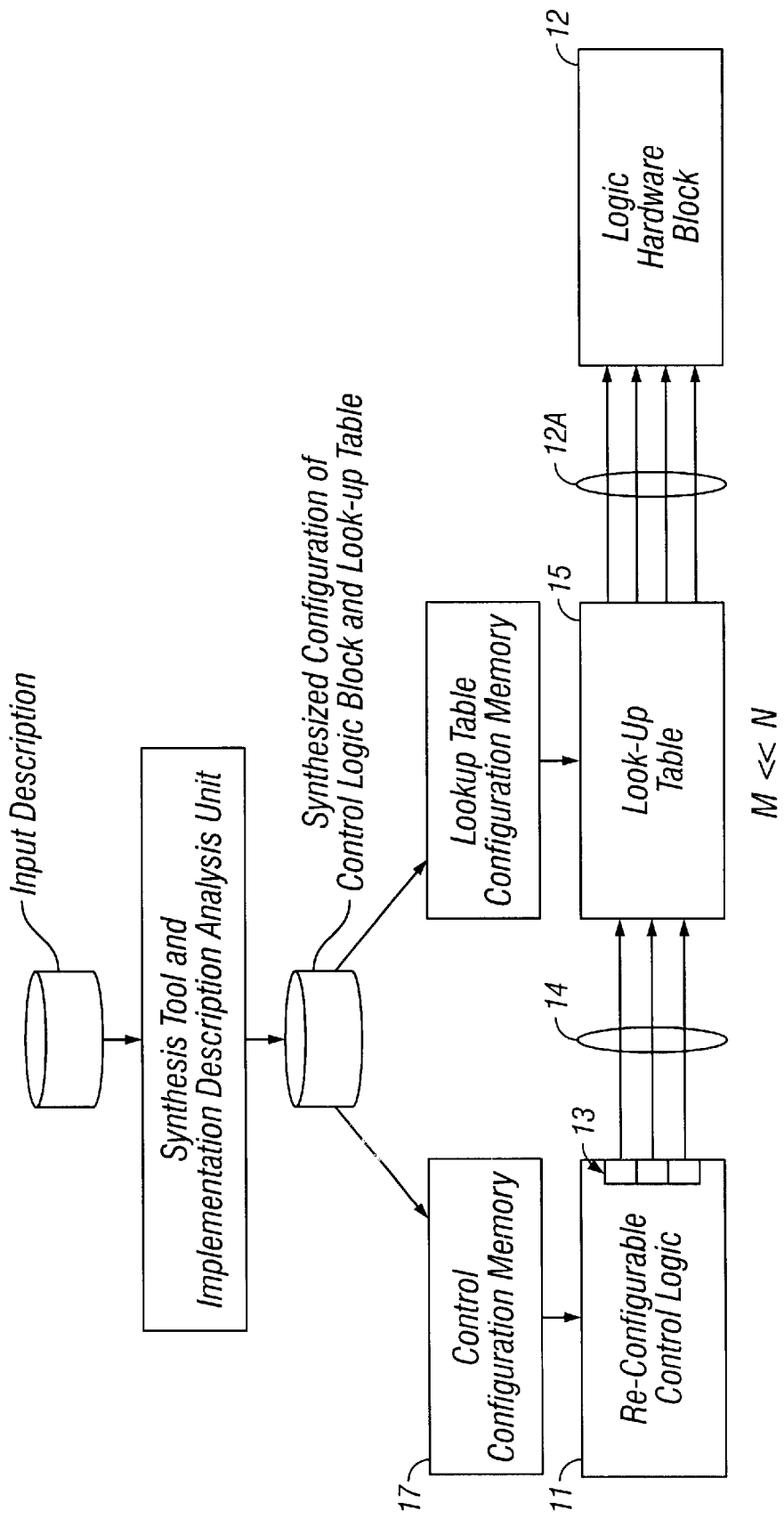
FIG. 2 shows an embodiment of a system having a control structure using a look-up table to store reachable state control words.

FIG. 2 shows a system including a control structure having a reconfigurable control logic block 11 and a logic hardware block 12. The logic hardware block 12 has N input control lines for receiving N control signals 12A for driving or configuring it to perform a given function as defined by an input description. The control logic block includes a set of output registers 13 for providing M control signals 14 for accessing a look-up table 15. The look-up table stores up to $2^M$ entries, where each entry is a N-bit reachable state control word (M<<N). The $2^M$ control words represent up to $2^M$ combinations (or reachable states) of N control signals for driving the logic hardware block as determined by the method of implementing the control structure shown in FIG. 2, as will be described herein below. The control logic block is configured to generate a M-bit address for accessing look-up table 15. The look-up table 15, in turn, outputs a N-bit control word for driving the logic hardware block 12 so as to perform the function as defined by the original input description.

In one embodiment, the control block is implemented using a programmable logic array (PLA). It is well understood in the field of circuit design that a PLA can be configured or programmed to perform essentially any boolean logic function by blowing the appropriate fuses to establish the necessary interconnections between the array devices. Hence, in this case programming is performed by determining which fuses are to be blown in order for the PLA to perform the desired function and then using programming circuitry to blow each fuse. In prior art PLAs, once it is programmed (i.e., once the fuses are blown) the logical function is set and the PLA cannot be reprogrammed. In other embodiments, the programmable logic array may be programmed or re-programmed using other well known techniques.

In a second embodiment, the control logic block 11 is implemented with a re-configurable PLA or a reconfigurable programmable sum of products (PSOP) generator such that the control logic block is reconfigurable (i.e., can be re-programmed/reconfigured to perform a new control function for each new system state).

One implementation of a reconfigurable PSOP is described in U.S. patent application Ser. No. 09/401,313, filed Sep. 23, 1999, assigned to the assignee of the present application, and incorporated herein by reference. The reconfigurable PSOP allows for multiple configurations to be associated with a programmable sum of products generator. These configurations can be modified by changing the configuration bits applied to the programmable sum of products generator. Hence, in this case the control logic block is programmed or configured by determining the set of configuration bits corresponding to the mapping function to be performed by the control logic block and coupling the configuration bits to the control logic block so as to configure it. FIG. 2 shows a configuration memory 17 for storing configuration bit streams for applying to the reconfigurable control logic block 11 dependent on the input description currently being implemented by the system.

Figure 1A:
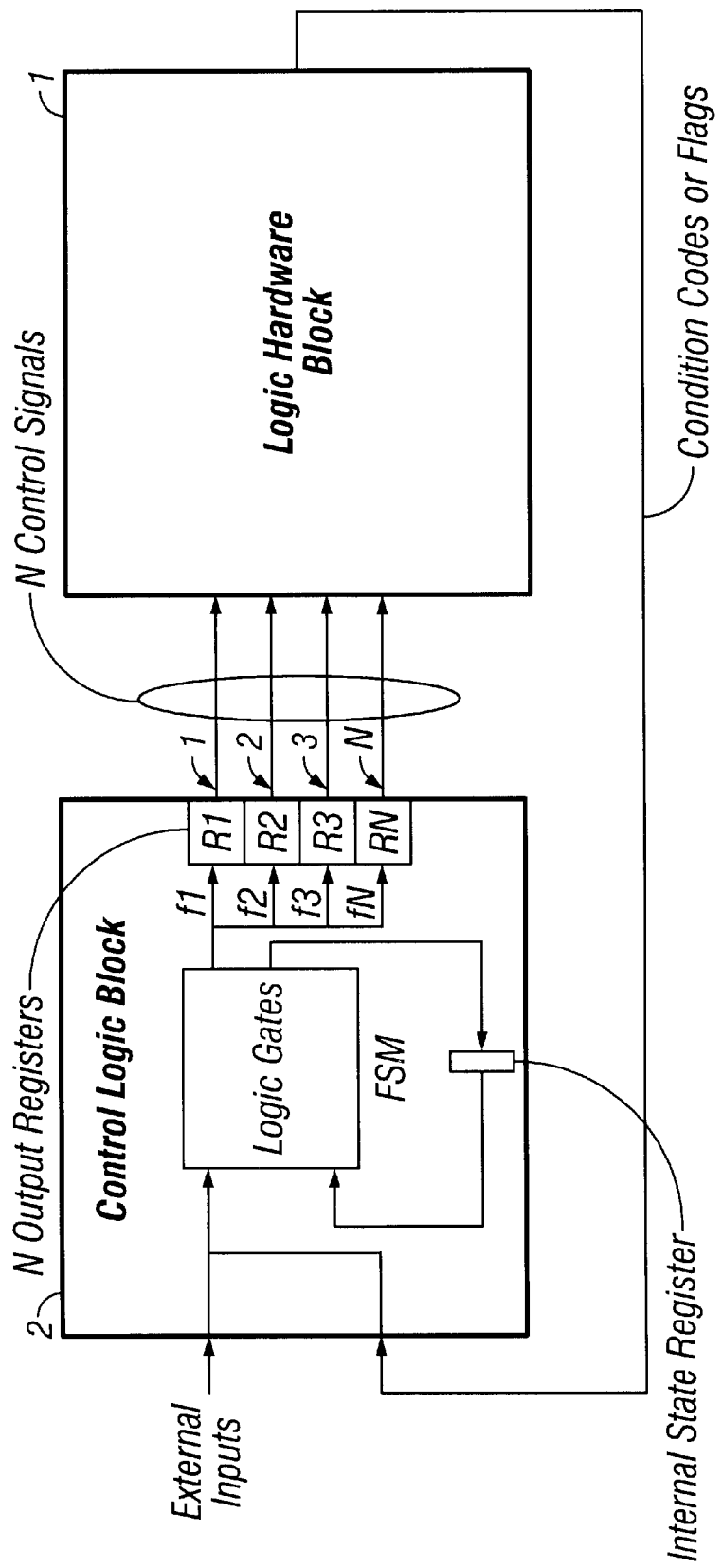
FIG. 1A shows a first prior art generalized control model.
Figure 1B:
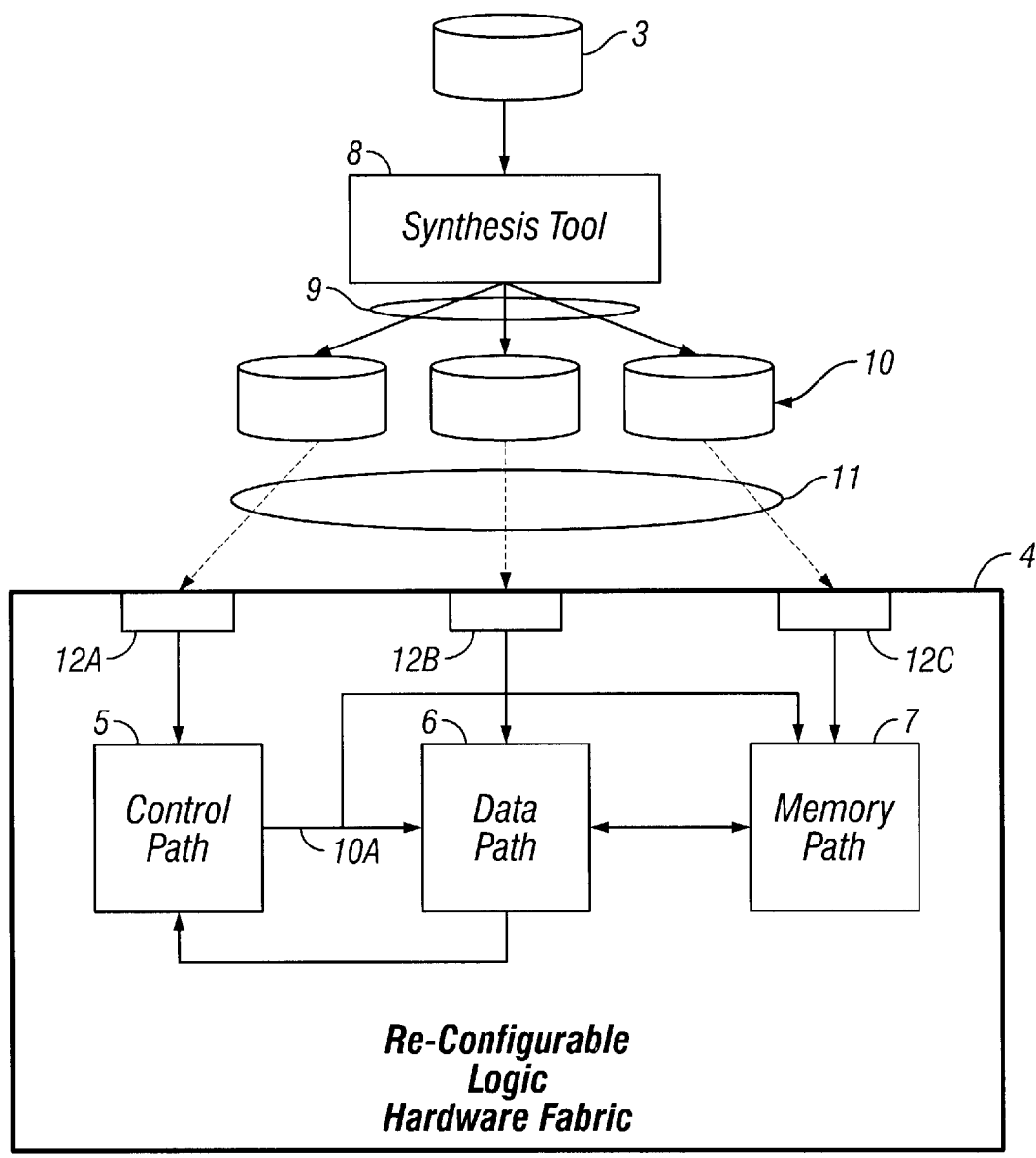
FIG. 1B shows a logic synthesis system including a reconfigurable logic fabric as described in U.S. Pat. No. 5,970,254 utilizing the control model as shown FIG. 1A.

The method of implementing the system shown in FIG. 2 is performed according to the following steps:

1) synthesizing or compiling the user input description defining the function to be simulated by the logic circuit to generate an implementation description in terms of the control model as shown in FIG. 1A. More specifically, the implementation description describes a control logic block having logic gates and registers which generates an N-bit control signal for driving a hardware logic block and further describes the logic hardware block.

2) analyzing the implementation description to determine the reachable states of the N-bit control signal for driving the logic hardware block;

2) creating a look-up table 15 by storing N-bit control words corresponding to each reachable state, one control word per entry;

3) configuring or programming the control logic block by:
   a) determining a mapping function between the reachable states of the N-bit control signal to a M-bit control word address for accessing each look-up table entry wherein each reachable state as defined by the original N driving signals is mapped to a different M-bit address and M<<N; and
   b) implementing the mapping function in the control logic block.

Figure 3A:
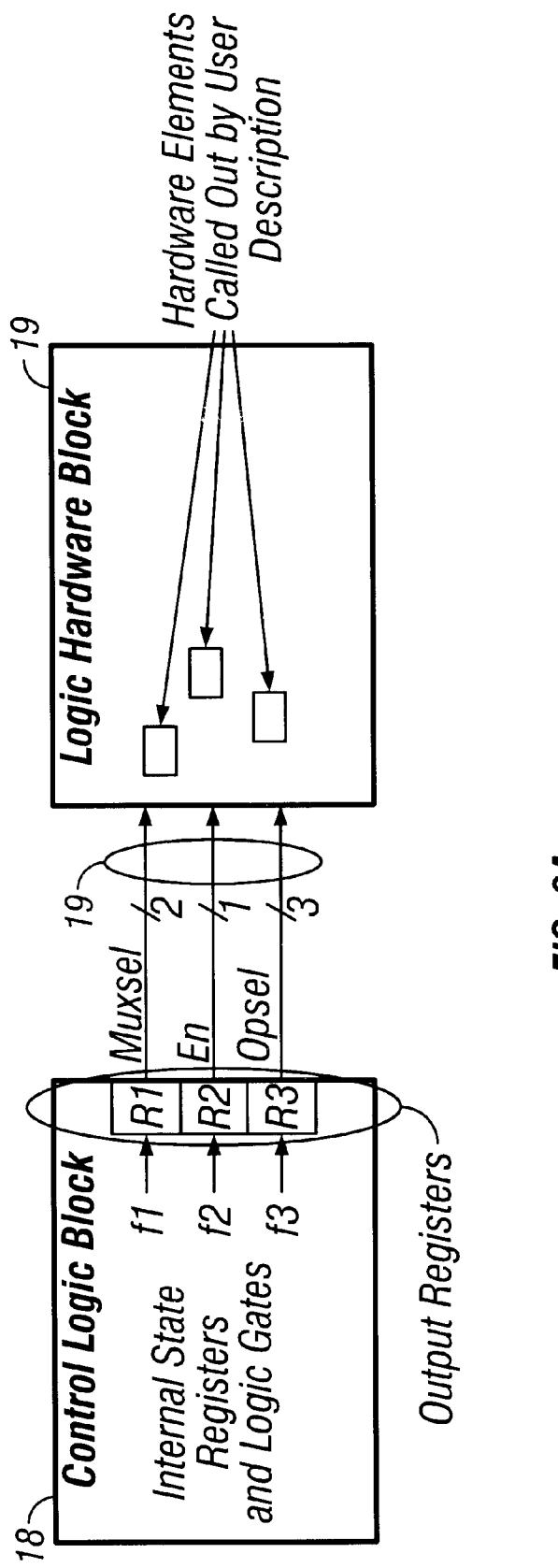
FIGS. 3A and 3B illustrate a specific example of the method of implementing a system having a control structure using a look-up table to store reachable states.

FIG. 3A shows an example of a synthesized system implemented in accordance with the control model shown in FIG. 1A. Specifically, this system is derived from the synthesis of a user input description which generates an implementation description of a system described in terms of a control model having a control logic block 18 which drives a logic hardware block 19 with a N-bit control signal 19 as shown in FIG. 3A. The implementation description is defined in terms of logic gates and registers which perform functions f1, f2, and f3 for driving registers R1–R3 to generate six user defined driving signals 19. In this example, the six driving signals 19 include a 2-bit multiplexer select signal (muxsel[1:0]), a 1-bit enable signal (en), and a 3-bit opcode signal (opsel[2:0]) as called out in the original input user description. It should be noted that in the system shown in FIG. 3A the six driving signals are provided directly from the control logic block to the logic hardware block.

Figure 3B:
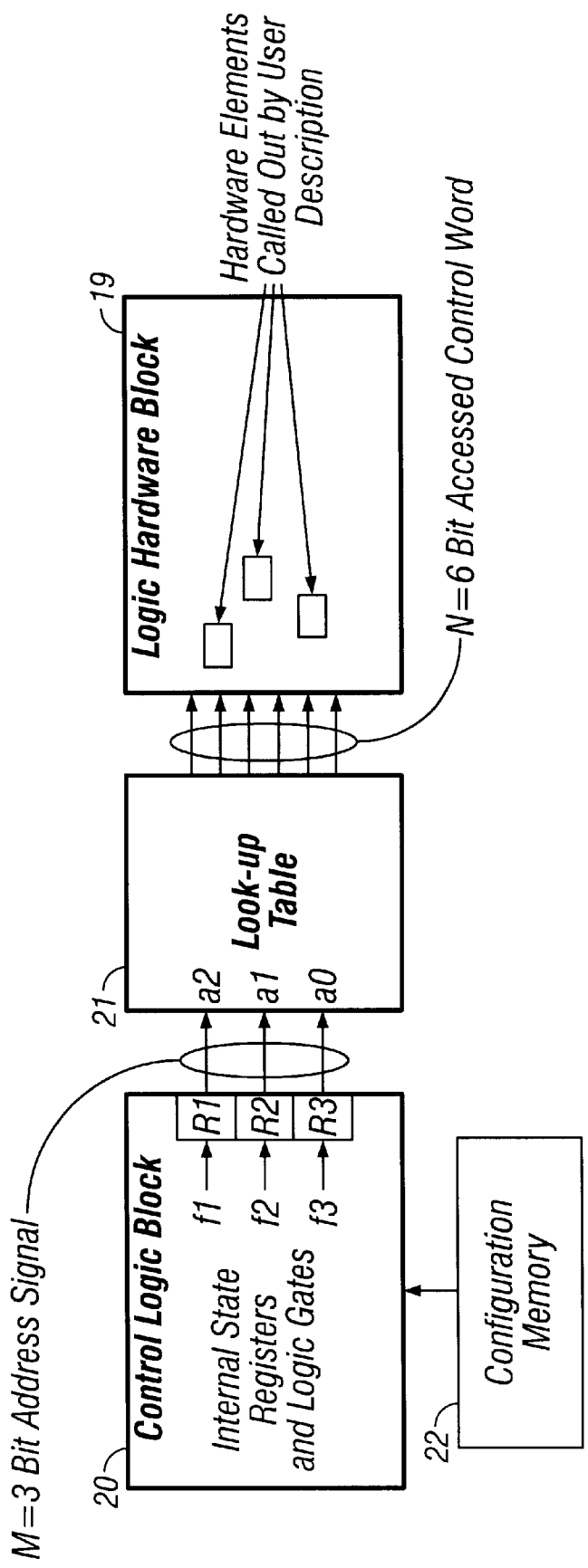

FIG. 3B shows an implementation of the system shown in FIG. 3A having a control structure using a reachable state table instead of providing control signals directly from the control logic block to the logic hardware block. The control structure of the system shown in FIG. 3B is derived by analyzing the implementation description generated by the synthesis of the user input description to determine the reachable states of the 6-bit driving signal 19. The analysis of the implementation description is performed by defining a vector X as the boolean variables, each variable representing a single register which includes both internal state and output registers (R1–R3) of control logic block 18 shown in FIG. 3A. The vector $X_{dpu}$ is the subset of output registers driving signal 19. For instance, in this example $X_{dpu}$= {muxsel[1:0], en, opsel[2:1]}. The reachable states of the registers are denoted $R(X_{dpu})$. The reachable states ($R(X_{dpu})$) can be defined by a single Boolean function in the form of Binary Decision Diagrams (BDDs) and represents the reachable combinations of the N-bit control signals that are possible given the original three functions f1–f3. Each minterm in the reachable states, function R(X), represents one valid reachable state of the internal state and output registers in the circuit. The reachable states, $R_{dpu}(X_{dpu})$, corresponds to the reachable sates of the registers, R1–R3, which drive the DPU in FIG. 3A and which are computed from R(X). For instance, in the case of the above example the reachable states for the three registers R1–R3 can be as follows: $R_{dpu}(X_{dpu})$={000000,101001,011001, 101100}. Hence, in this case, there are four minterms or reachable states.

Once the reachable states are determined, they are stored in a look-up table 15 and a mapping function is determined between the address for accessing the look-up table and each reachable state entry in the table. The mapping function can be determined by evaluating the reachable state information and using logic synthesis to obtain the mapping. The maximum number of entries in the table is $2^M$ and a M-bit control signal is provided from the control logic block 13 to access it. It should be understood that the total number of reachable states cannot exceed the number of $2^M$ entries. The step of mapping the reachable states to an address for accessing the look-up table effectively assigns each reachable state to one of the look-up table entries.

Continuing with the example show in FIGS. 3A and 3B, assuming that the address lines into the look-up table are A={$a_2$, $a_1$, $a_0$} and assigning variables $X_{dpu}$=(a,b,c,d,e,f) as minterm variables, then one possible reachable state assignment for each of the four reachable states can be as follows:

TABLE 1

| Reachable States (a, b, c, d, e, f) | Assigned Address ($a_2$, $a_1$, $a_0$) |
| --- | --- |
| 000000 | 000 |
| 101001 | 001 |
| 011001 | 010 |
| 101100 | 100 |

From the above reachable state and address assignment, a mapping function can be determined corresponding to the assignment which is expressed in terms of a function (f1'–f3') for each of the registers R1'–R3' in control logic block 20 for driving input ports $a_M, \ldots a_1, a_0$ (i.e., $a_2, a_1, a_0$) in look-up table 21 (FIG. 3B)

It should be noted that this assignment can be a straight-forward mapping which creates a function defining each $a_M$, $\ldots a_1, a_0$ by taking into account all of the conditions of the variables (a,b,c,d,e,f) of the reachable states. For instance, a non-minimized function defining $a_2$ for the above example would be as follows:

$$f(a_2) = (a \cdot \bar{b} \cdot c \cdot d \cdot \bar{e} \cdot f) \qquad \text{eq. 1}$$

Alternatively, this mapping can be minimized by exploiting "don't care" conditions and using Quine McCluskey logic function minimization as described in Chapter 7, section 7.9–7.10 of: "Logic Synthesis and Verification Algorithms" by Gary D. Hachtel and Fabio Somenzi and Chapter 7 of: "Synthesis and Optimization of Digital Circuits" by Giovanni De Michelli both incorporated herein by reference. For instance for the example above an on-set/off-set determination can be performed as follows:

$a_2$ on-set={101100}, $a_2$ off-set={000000,101001, 011001}

$a_1$ on-set={011001}, $a_1$ off-set={000000, 101001,101100}

$a_0$ on-set={101001}, $a_0$ off-set={000000, 011001, 101100}

The functions for $a_2$, $a_1$, and $a_0$ are computed from the above on-set and off-set table combined with the original functions driving each of the reachable state variables a,b,c,d,e,f (see Table 1). For instance, in the above example, a minimized function for $a_2$ can be determined to be {1-----0} where "-" is a "don't care" condition for a given variable. In this case, $a_2$ can be defined by the function:

$$f(a_2) = a \cdot \bar{f} \qquad \text{eq. 2}$$

In other words, no matter what variables b,c,d,e are if a=1 and f=0, then $a_2$=1. Each of $a_1$ and $a_0$, can be minimized similarly.

To achieve an optimal minimization, all assignments of addresses are explored to minimize the control block logic. Specifically, all permutations of column 2 rows (Table 1) are explored for optimal minimization.

Next, the control logic block is configured or programmed to implement the determined mapping function f1'–f3' depending on the embodiment of control logic block 20. For instance, if block 20 is implemented as a standard PLA where it is programmable only once via destructive programming (e.g., blowing fuses), then the appropriate fuses are blown to implement the determined mapping functions. Alternatively, if the control logic block 20 is implemented as a re-configurable PLA or a re-configurable programmable sum of products (PSOP) generator such as the reconfigurable PSOP described in U.S. patent application Ser. No. 09/401,313 control logic block 20 can be configured by programming with configuration memory bits. In this case, the control logic block is reconfigured each time a new set of configuration bits is applied to it. The control logic block can then be reconfigured dependent on each new set of input statements and corresponding new set of configuration bits.

In one embodiment, configuration bit streams are stored in an associated optional configuration memory 22 as shown in FIG. 3B. In this embodiment, for each new system state, a new set of configuration bits may be used to configure the control logic block 20.

Once the control logic block is configured to perform the determined mapping function and the look-up table 21 is loaded with the reachable state control words, control logic block 20 functions to generate a M-bit control signal for accessing a N-bit reachable state control word from the look-up table 21. The look-up table, in turn, drives the logic hardware block 19 with the N-bit control word to perform the function as defined by the user input statements.

Hence, in accordance with the system and method of control shown in FIGS. 2 and 3B, instead of designing a system control structure in which the control logic block is implemented to provide a N-bit control signal directly to the N input lines of the logic hardware block, the control logic block is configured to generate an optimized M-bit control signal based on minimized reachable state functions (where M<N) for accessing a look-up table which stores N-bit reachable state control words for driving the logic hardware block. As a result, control logic block circuitry is minimized since it need only generate a M-bit control signal instead of a N-bit control signal.

Figure 4:
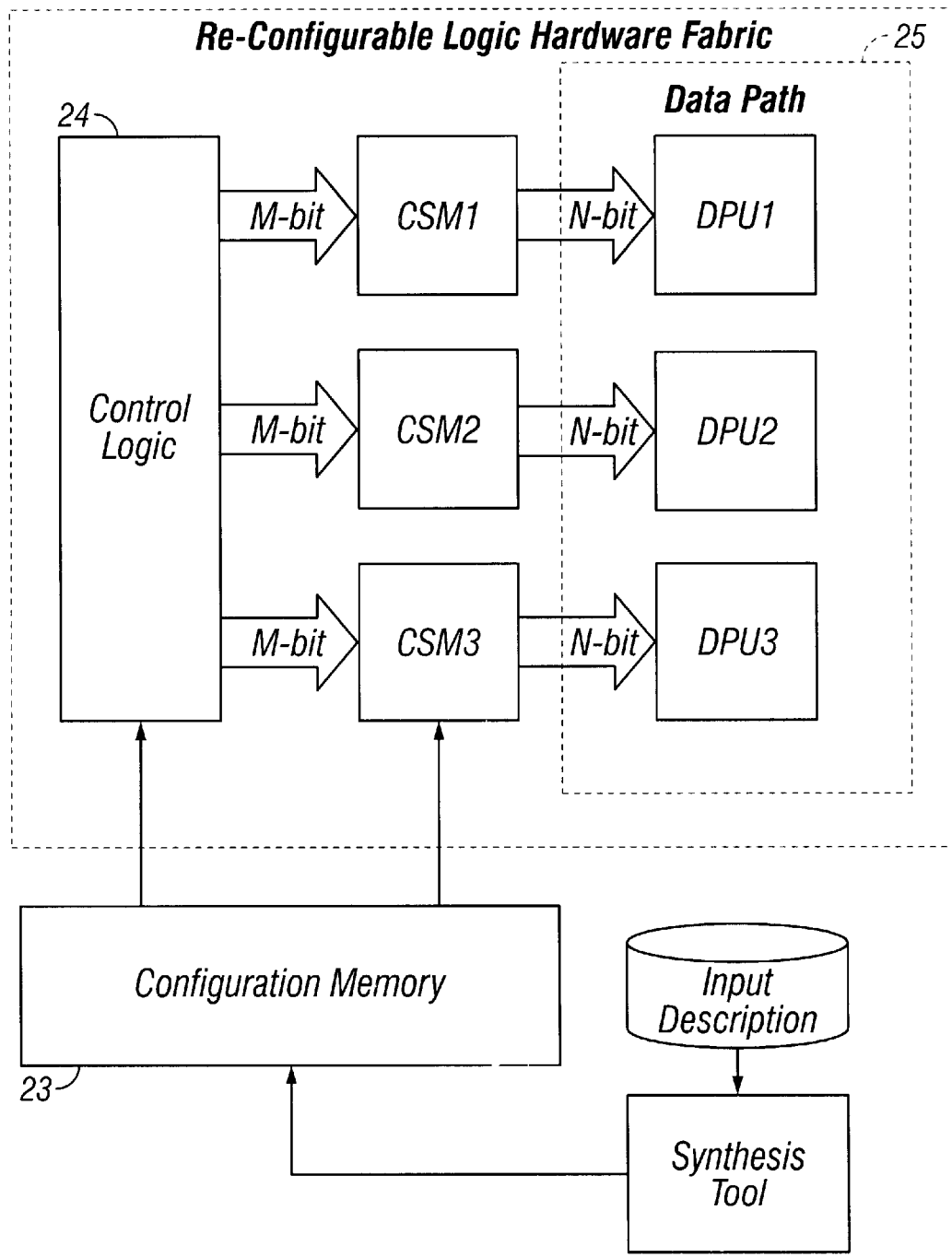
FIG. 4 shows an embodiment of a logic synthesis system including a reconfigurable logic hardware fabric and having a control structure using a configuration storage memory (CSM) for storing reachable states.

This condensed storage of programming information (i.e., the minimization of the control logic block used in unison with the reachable state look-up table) is very effective for reconfigurable applications. FIG. 4 shows an alternate embodiment of the system and method of control using stored reachable state control words as employed in a reconfigurable logic synthesis system having a reconfigurable logic hardware fabric which includes at least a reconfigurable control path 24 and reconfigurable datapath 25 where the datapath includes a plurality of programmable datapath units (DPU1–DPU3). A user input description defines the function to be simulated by the control path and the datapath. In one embodiment the user input description comprises hardware description language statements such as Verilog HDL statements. It should be noted that datapath 25 can include more than three DPUs. In one embodiment, programmable datapath units are embodied such as described in U.S. patent application Ser. No. 09/307,072, filed May 7, 1999, assigned to the assignee of the present application, and incorporated herein by reference.

Each programmable datapath unit is controlled by a N-bit control signal to perform a plurality of functions including addition, subtraction, multiplexing, incrementing, standard and custom logic functions, and conditional operations. Each DPU has its own associated look-up table or configuration storage memory (CSM1–CSM3) for providing a N-bit reachable state control word in response to a M-bit control signal address provided from control path 24. For each DPU, the control path is configured to implement determined mapping functions between reachable states stored in its corresponding CSM and addresses for accessing the CSM.

According to the method of implementing the system shown in FIG. 4, initially, a user input description defining the functions of the control and datapath is synthesized to generate an implementation description of the control and datapath logic blocks in terms of a control model as shown in FIG. 1A. The implementation description is analyzed to identify hardware elements (multiplexers, adders, etc.) called out within the description so as to group these hardware elements in an efficient manner into specific DPUs. This evaluation step may be performed in a variety of manners which are well known in the field of computer science such as scanning the implementation description code for identifiable aspects. For instance, particular syntax traits or terminologies which identify specific hardware elements may be identified.

Next, the implementation description is analyzed to determine the reachable states of the N-bit control signal for driving each of the DPUs. Reachable states are determined in the same manner as described above for the example shown in FIGS. 3A and 3B. Specifically, the N-bit control signal, as defined by the implementation description for each of the DPUs, is analyzed to formulate a single Boolean function in the form of a Binary Decision Diagrams (BDDs) which represents the reachable combinations of the N-bit control signal that are possible given the user input description. Each minterm in the reachable states function represents one valid reachable state of the internal state and output registers associated with the N-bit control signal for driving each DPU.

A CSM is created for each DPU (CSM1–CSM3) in which each entry in the table stores a N-bit reachable state control word corresponding to one of the determined reachable state of the N-bit control signal for driving each DPU. Each entry in a given CSM represents configuration or control information for driving assigned grouped hardware elements within its corresponding DPU to perform functions as originally designated in the user input description. For instance, if three hardware elements are grouped and assigned to DPU1 having an associated set of control signals, CSM1 would store the corresponding reachable states of the associated set of control signals for driving DPU1.

Next, a control path 24 is programmed or configured by 1) determining the mapping function between the reachable states of the original driving signals corresponding to the grouped hardware elements in each DPU and the addresses for accessing each DPU's corresponding CSM table and by 2) by determining corresponding configuration bits for implementing the determined mapping function in the reconfigurable control path 24. The mapping function can be determined as above in a straightforward manner in which a non-minimized logic function is determined for providing each of the M-bit control signal addresses. Alternatively, the mapping function can be minimized so as to reduce the logic circuitry in control path 24.

In the case in which control path 24 is embodied as a reconfigurable PSOP described in U.S. patent application Ser. No. 09/401,313, configuration bits can be stored in a configuration memory 23 and used to configure the control path.

Once the control path is configured and the CSMs are loaded the circuit shown in FIG. 4 performs the function as defined by the user input description such that the control path 24 outputs a M-bit control signal for accessing each of CSM1–CSM3. Each CSM, in response, outputs a N-bit reachable state control word for driving its corresponding DPU to cause it to perform the function as defined by the user input description for the DPU's corresponding grouped elements.

Hence, an efficient control system is obtained which reduces logic circuitry within the control logic block of the structure and reduces total control signals that are generated by the control logic block of the structure and their associated routing. The system and method of control are particularly adaptable to a system which includes reconfigurable/reprogrammable control logic block and logic hardware block elements.

In the preceding description, numerous specific details are set forth, such as specific implementations of the control logic block and the logic hardware block in order to provide a thorough understanding of the present invention. It will be apparent, however, to one skilled in the art that these specific details need not be employed to practice the present invention. In other instances, well known processing system elements and operations have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What I claim is:

1. A method of implementing a system defined by a user input description, said system having a control logic block and a logic hardware block, said method comprising the steps of:
   synthesizing said user input description so as to generate an implementation description which includes a description of a control model of said system in which a control model control logic block drives a control model logic hardware block with a N-bit control signal;
   analyzing said implementation description to determine reachable states of said N-bit control signal;
   creating a look-up table by storing a N-bit reachable state control word corresponding to each of said reachable states in a digital storage area, each N-bit reachable state control word being accessible by a corresponding M-bit address, wherein M<N;
   configuring said control logic block by:
   a) determining a mapping function between said reachable state control words and M-bit control word addresses for accessing said look-up table and;
   b) implementing said mapping function in said control logic block.

2. The method as described in claim 1 wherein said step of implementing said mapping function is performed by programming said control logic block with a set of configuration bits causing said control logic block to perform said mapping function.

3. The method as described in claim 2 further comprising the step of storing said set of configuration bits in a configuration data memory.

4. The method as described in claim 1 wherein said logic hardware block comprises a plurality of programmable datapath units (DPUs) each having N input ports and wherein said step of analyzing said implementation description further comprises the step of analyzing said implementation description so as to group and assign hardware elements called out in said implementation description to specific ones of said DPUs and determining reachable states of said N-bit control signal corresponding to said each DPU.

5. The system as described in claim 4 wherein said step of creating a look-up table further comprising the step of creating a separate look-up table storing N-bit reachable state control words corresponding to said each DPU.

6. The method as described in claim 1 wherein said step of analyzing said implementation description comprises the step of defining a single function representing said reachable states based on a binary decision diagram.

7. The method as described in claim 1 wherein said step of determining said mapping function comprises the step of using Quine McCluskey logic function minimization of said mapping function by evaluating on-set and off-set conditions of said address and said reachable states.

8. The method as described in claim 1 wherein said user input description is described in terms of a hardware description language (HDL).

9. The method as described in claim 8 wherein said hardware description language (HDL) is Verilog description language.

10. The method as described in claim 1 wherein said user input description is described in terms of a higher level programming language.

11. The method as described in claim 10 wherein said higher level programming language is C programming language.

12. A system having an associated user input description synthesized to generate an implementation description, said implementation description including a description of a control model of said system in which a control model control logic block drives a control model logic hardware block with a N-bit control signal, said system comprising:

a digital storage memory look-up table having M or less N-bit control words corresponding to predetermined reachable states of said N-bit control signal, each N-bit control word having an associated M-bit address for accessing said look-up table, where M<N;

a control logic block being programmed to perform a mapping function between said predetermined reachable states and said M-bit addresses;

a logic hardware block being driven by accessed N-bit control words from said look-up table to perform functions as defined by said user input description.

13. The system as described in claim 12 wherein said mapping function is a minimized mapping function.

14. The system as described in claim 12 wherein said control logic block is reprogrammable and said control logic block is programmed with a set of configuration bits to perform said mapping function.

15. The system as described in claim 14 further comprising a configuration data memory for storing said set of configuration bits.

16. A reconfigurable system having an associated user input description synthesized to generate an implementation description, said implementation description including a description of a control model of said reconfigurable system in which a reconfigurable control model control logic block drives a reconfigurable control model logic hardware block with a plurality of N-bit control signals, each N-bit control signal for driving a control model datapath unit with said control model logic hardware block, said system comprising:

a plurality of digital storage memory look-up tables each having M or less, N-bit control words corresponding to predetermined reachable states of each of said N-bit control signals, each N-bit control word having an associated M-bit address for accessing said N-bit control word in its corresponding look-up table, where M<N;

a plurality of reconfigurable datapath units each having N input signal inputs and each corresponding to one of said plurality of look-up tables, wherein in response to an accessed N-bit control word from its said corresponding look-up table each of said datapath units is controlled to perform functions associated with grouped hardware elements called out within said implementation description;

a reconfigurable control logic block programmed to perform a plurality of mapping functions, each of said mapping functions mapping a function between said N-bit control words stored in said one of said look-up tables and said M-bit addresses for accessing said one digital look-up table.

17. The system as described in claim 16 wherein said mapping function is a minimized mapping function.

18. The system as described in claim 17 wherein said reconfigurable control logic block is programmed with a set of configuration bits to perform said mapping function.

19. The system as described in claim 18 further comprising a configuration data memory for storing said set of configuration bits.

* * * * *